(12) United States Patent
Endo et al.

(10) Patent No.: US 10,134,593 B2
(45) Date of Patent: Nov. 20, 2018

(54) SEMICONDUCTOR DEVICE AND METHOD FOR MANUFACTURING SAME

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Takeshi Endo, Kariya (JP); Atsuya Akiba, Kariya (JP); Yuichi Takeuchi, Kariya (JP); Hidefumi Takaya, Toyota (JP); Sachiko Aoi, Nagakute (JP)

(73) Assignees: DENSO CORPORATION, Kariya (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/570,841

(22) PCT Filed: Apr. 5, 2016

(86) PCT No.: PCT/JP2016/001907
§ 371 (c)(1),
(2) Date: Oct. 31, 2017

(87) PCT Pub. No.: WO2016/194280
PCT Pub. Date: Dec. 8, 2016

(65) Prior Publication Data
US 2018/0151366 A1    May 31, 2018

(30) Foreign Application Priority Data
May 29, 2015 (JP) .................. 2015-110269

(51) Int. Cl.
*H01L 29/00* (2006.01)
*H01L 21/20* (2006.01)
(Continued)

(52) U.S. Cl.
CPC ........ *H01L 21/2003* (2013.01); *H01L 21/265* (2013.01); *H01L 29/06* (2013.01);
(Continued)

(58) Field of Classification Search
CPC ............... H01L 21/2003; H01L 21/265; H01L 21/0475; H01L 21/26586; H01L 21/266;
(Continued)

(56) References Cited

U.S. PATENT DOCUMENTS

2005/0233539 A1    10/2005  Takeuchi et al.
2007/0072398 A1    3/2007   Shibata et al.
(Continued)

FOREIGN PATENT DOCUMENTS

| JP | 2011-101036 | * | 5/2011 | ............. H01L 29/78 |
| JP | 2011-176157 A | | 9/2011 | |

OTHER PUBLICATIONS

Sugiyama et al., "Growth Mechanism and 2D Aluminum Dopant Distribution of Embedded Trench 4H—SiC Region". Materials Science Forum, vols. 600-603 (2009) pp. 171-174, Trans Tech Publications, Switzerland.

*Primary Examiner* — Nikolay Yushin
(74) *Attorney, Agent, or Firm* — Posz Law Group, PLC

(57) ABSTRACT

A semiconductor device includes: a substrate having a cell region with a semiconductor element and an outer peripheral region; and a drift layer on the substrate. The semiconductor element includes a base region, a source region, a trench gate structure, a deep layer deeper than a gate trench, a source electrode, and a drain electrode. The outer peripheral region has a recess portion in which the drift layer are exposed, and a guard ring layer. The guard ring layer includes multiple guard ring trenches having a frame shape, surrounding the cell region and arranged on an exposed surface of the drift layer, and a first guard ring in the guard ring trenches. Each
(Continued)

of the linear deep trenches has a width equal to a width of each of the linear guard ring trenches.

12 Claims, 10 Drawing Sheets

(51) Int. Cl.

| | |
|---|---|
| *H01L 21/265* | (2006.01) |
| *H01L 29/78* | (2006.01) |
| *H01L 29/06* | (2006.01) |
| *H01L 29/12* | (2006.01) |
| *H01L 29/08* | (2006.01) |
| *H01L 29/16* | (2006.01) |
| *H01L 21/00* | (2006.01) |
| *H01L 21/04* | (2006.01) |

(52) U.S. Cl.
CPC ...... *H01L 29/0657* (2013.01); *H01L 29/0843* (2013.01); *H01L 29/12* (2013.01); *H01L 29/1608* (2013.01); *H01L 29/78* (2013.01); *H01L 21/046* (2013.01)

(58) Field of Classification Search
CPC ............ H01L 29/0657; H01L 29/0843; H01L 29/1608; H01L 29/78
See application file for complete search history.

(56) References Cited

U.S. PATENT DOCUMENTS

2009/0200559 A1  8/2009  Suzuki et al.
2012/0273801 A1  11/2012  Watanabe et al.

\* cited by examiner

SEMICONDUCTOR DEVICE AND METHOD FOR MANUFACTURING SAME

CROSS REFERENCE TO RELATED APPLICATIONS

This application is a U.S. national stage application of International Patent Application No. PCT/JP2016/001907 filed on Apr. 5, 2016 and is based on Japanese Patent Application No. 2015-110269 filed on May 29, 2015, the disclosure of which is incorporated herein by reference.

TECHNICAL FIELD

The present disclosure relates to a semiconductor device having a deep layer and a guard ring layer and a method for manufacturing a semiconductor device, and more particularly, to a silicon carbide (hereinafter, abbreviated to SiC) semiconductor device.

BACKGROUND ART

Attention has been paid to SiC as a material of a power device capable of obtaining high breakdown field strength. However, in a SiC trench gate MOSFET, breakdown field strength of SiC is so high that an electric field applied to a gate insulating film at a bottom of the trench is too high to realize a required life. Accordingly, an electric field at the bottom of the trench needs to be relaxed.

A structure having a p-type deep layer deeper than the bottom of the trench is proposed as a structure capable of relaxing an electric field at the bottom of the trench as above. By adopting such a structure, field concentration at the bottom of the trench can be relaxed by restricting an electric field from entering the bottom of the trench when the MOSFET is OFF. Consequently, breaking of the gate insulating film can be prevented.

However, an impurity hardly diffuses in SiC and it is difficult to provide a p-type deep layer over 1 μm deep by ion implantation and thermal diffusion of an impurity.

Non Patent Literature 1 discloses a method of providing a p-type deep layer of a great depth developed as an embedded epitaxial technique, by which a p-type layer is epitaxially grown to fill a trench. When the embedded epitaxial technique as above is used, a p-type deep layer over, for example, 1 μm deep can be formed by using neither ion implantation nor thermal diffusion of an impurity.

In a SiC semiconductor device, a p-type deep layer is provided in a cell region, and a p-type guard ring layer is provided in an outer peripheral region in which an outer peripheral breakdown voltage structure is formed to enclose an outer periphery of the cell region. Both of the p-type deep layer and the p-type guard ring layer can be provided by the embedded epitaxial technique.

However, a shape abnormality and surface irregularities are conformed with a p-type deep layer of a great depth and a p-type guard ring layer provided by the embedded epitaxial technique. For example, as is shown in FIG. 11A, a region where the layers are embedded expands due to a difference in width among trenches J1, or as is shown in FIG. 11B, a shape abnormality and surface irregularities occur at an intersection of two linear trenches J1.

When a trench gate formation process is performed later in presence of such irregularities, a desired gate shape cannot be obtained. Accordingly, leakage through the gate insulating film may occur and a required life cannot be realized due to a failure in sufficiently relaxing an electric field at the bottom of the trench. Because the p-type deep layer and the p-type guard ring layer are designed individually, a shape abnormality and irregularities on the surface readily occur particularly when the both layers are provided at a time.

Meanwhile, the surface may be planarized by grinding or polishing to remove surface irregularities. However, SiC is too hard to be processed with good control performance. It thus becomes necessary to planarize a surface of a p-type deep layer by improving patterns of trenches in which embedded epitaxy takes place.

The above has described a case where SiC is used as a semiconductor material. However, similar problems arise even when a p-type deep layer is provided by the embedded epitaxial technique using a semiconductor material other than SiC, for example, Si (silicon) or GaN (silicon nitride).

NON PATENT LITERATURE

Non Patent Literature 1: Materials Science Forum Vols. 600-603 (2009) pp 171-174, Growth Mechanism and 2D Aluminum Dopant Distribution of Embedded Trench 4H—SiC Region, N. Sugiyama et. al.

SUMMARY

It is an object of the present disclosure to provide a semiconductor device capable of planarizing surfaces of a deep layer and a guard ring layer and reducing leakage through a gate insulating film, and a method for manufacturing such a semiconductor device.

According to a first aspect of the present disclosure, a semiconductor device includes: a substrate with a first conductive type or a second conductive type having a cell region and an outer peripheral region; and a drift layer with the first conductive type arranged on the substrate and having an impurity concentration lower than the substrate. The cell region has a semiconductor element. The semiconductor element includes a base region with the second condition type arranged on the drift layer, a source region with the first conductive type arranged on the base region and having an impurity concentration higher than the drift layer, a trench gate structure having a gate trench arranged from a surface of the source region to be deeper than the base region, a gate insulating film arranged on an inner wall of the gate trench, and a gate electrode arranged on the gate insulating film, a deep layer having a first layer embedded in each of a plurality of deep trenches that are arranged from a surface of the drift layer to be deeper than the gate trench and have a line shape, a source electrode electrically connected to the source region and the base region, and a drain electrode arranged on a back side of the substrate. The semiconductor element provides a channel region in a surface portion of the base region located on a side of the gate trench by controlling a voltage applied to the gate electrode, and flows a current between the source electrode and the drain electrode via the source region and the drift layer. The outer peripheral region surrounding an outer periphery of the cell region has a recess portion in which the source region and the base region are removed and the drift layer are exposed, and a guard ring layer. The guard ring layer includes a plurality of guard ring trenches having a line frame shape, surrounding the cell region and arranged on a surface of the drift layer exposed in the recess portion, and a first guard ring with the second conductive type disposed in the guard ring trenches and having an impurity concentration equal to the first layer. Each of the linear deep trenches has a width equal to a width of each of the linear guard ring trenches.

In the manner as above, the deep trenches and the guard ring trenches in which to provide the deep layer and the guard ring layer, respectively, are formed in a same width. Hence, a shape abnormality and irregularities on a surface of the layer of the second conduction type occurring when embedded into the respective trenches by embedded epitaxy can be restricted. Because the surface of the layer of the second conduction type can be of a planar shape without irregularities, processing is applied to the planar surface in subsequent processes. Hence, a desired gate shape can be obtained when various processes to form the trench gate structure are performed. Consequently, leakage through the gate insulating film can be reduced.

According to a second aspect of the present disclosure, a method for manufacturing the semiconductor device according to the first aspect includes: forming the drift layer on a main surface of the substrate; arranging a mask on the drift layer having an opening for a deep-trench-to-be-formed region and a guard-ring-trench-to-be-formed region, and forming the deep trenches and the guard ring trenches at a same time by etching the drift layer using the mask; epitaxially growing an impurity layer with the second conductive type on the drift layer to fill the deep trenches and the guard ring trenches; and forming the first layer in each of the deep trenches and the first guard ring in each of the guard ring trenches by removing the impurity layer with the second conductive type formed on the drift layer and planarizing a surface.

According to the method for manufacturing the semiconductor device configured as above, a shape abnormality and irregularities on the surface of the layer of the second conduction type occurring when embedded into the respective trenches by embedded epitaxy can be restricted. Because the surface of the layer of the second conduction type can be of a planar shape without irregularities, processing is applied to the planar surface in subsequent processes. Hence, a desired gate shape can be obtained when various processes to form the trench gate structure are performed. Consequently, leakage through the gate insulating film can be reduced.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
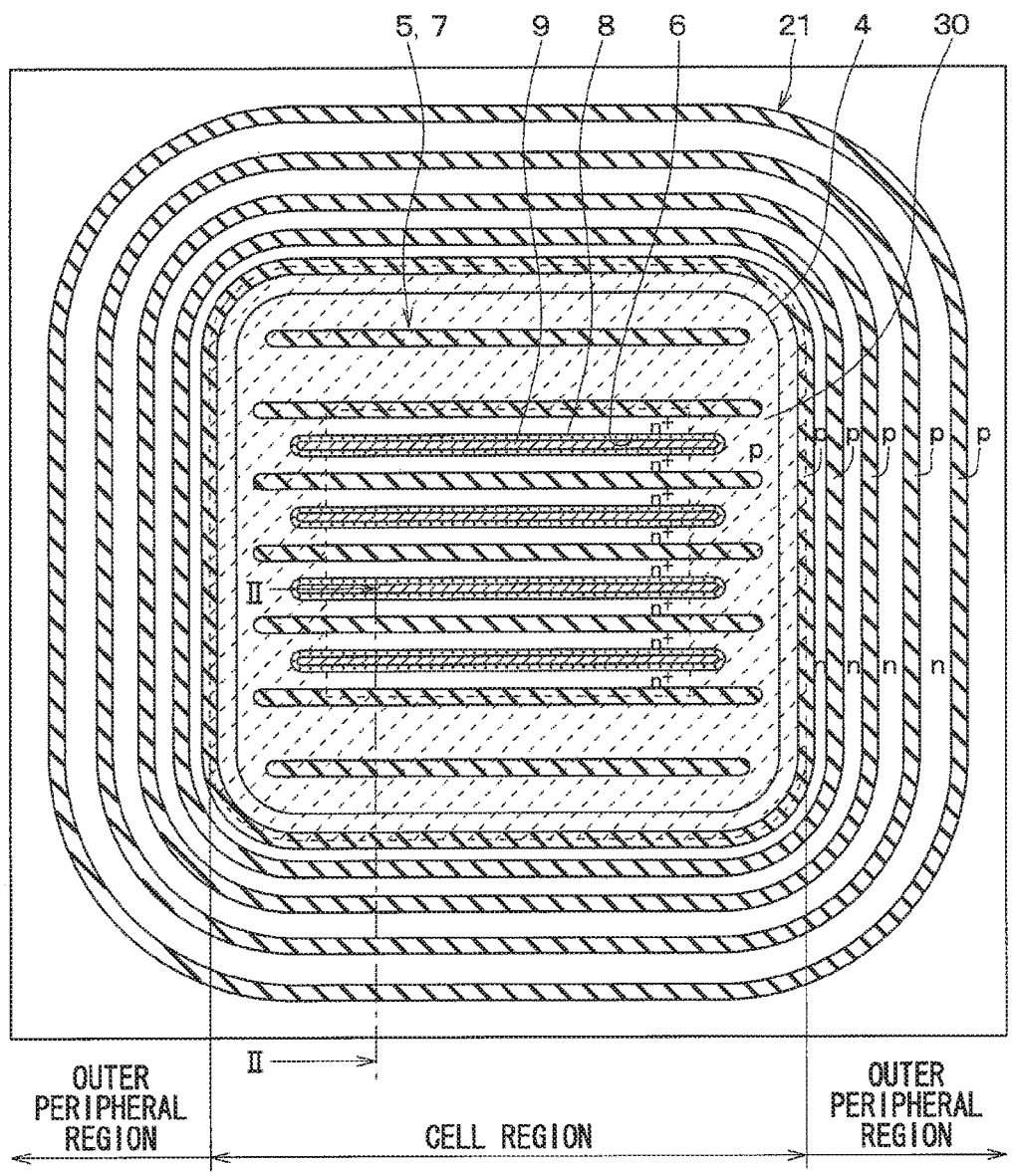
FIG. 1 is a view showing a layout on a top surface of a SiC semiconductor device according to a first embodiment of the present disclosure.

Hereinafter, embodiments of the present disclosure will be described according to the drawings while labeling same or equivalent portions in respective embodiments below with same reference numerals.

First Embodiment

A first embodiment of the present disclosure will be described. The following will describe a SiC semiconductor device provided with an inverting MOSFET as a trench gate MOSFET by way of example.

The SiC semiconductor device shown in FIG. 1 has a cell region in which a trench gate MOSFET is provided as a semiconductor element, and an outer peripheral region (termination structure region) in which an outer peripheral breakdown voltage structure enclosing the cell region is provided. FIG. 1 is not a cross section but hatched in part for ease of view.

Figure 2:
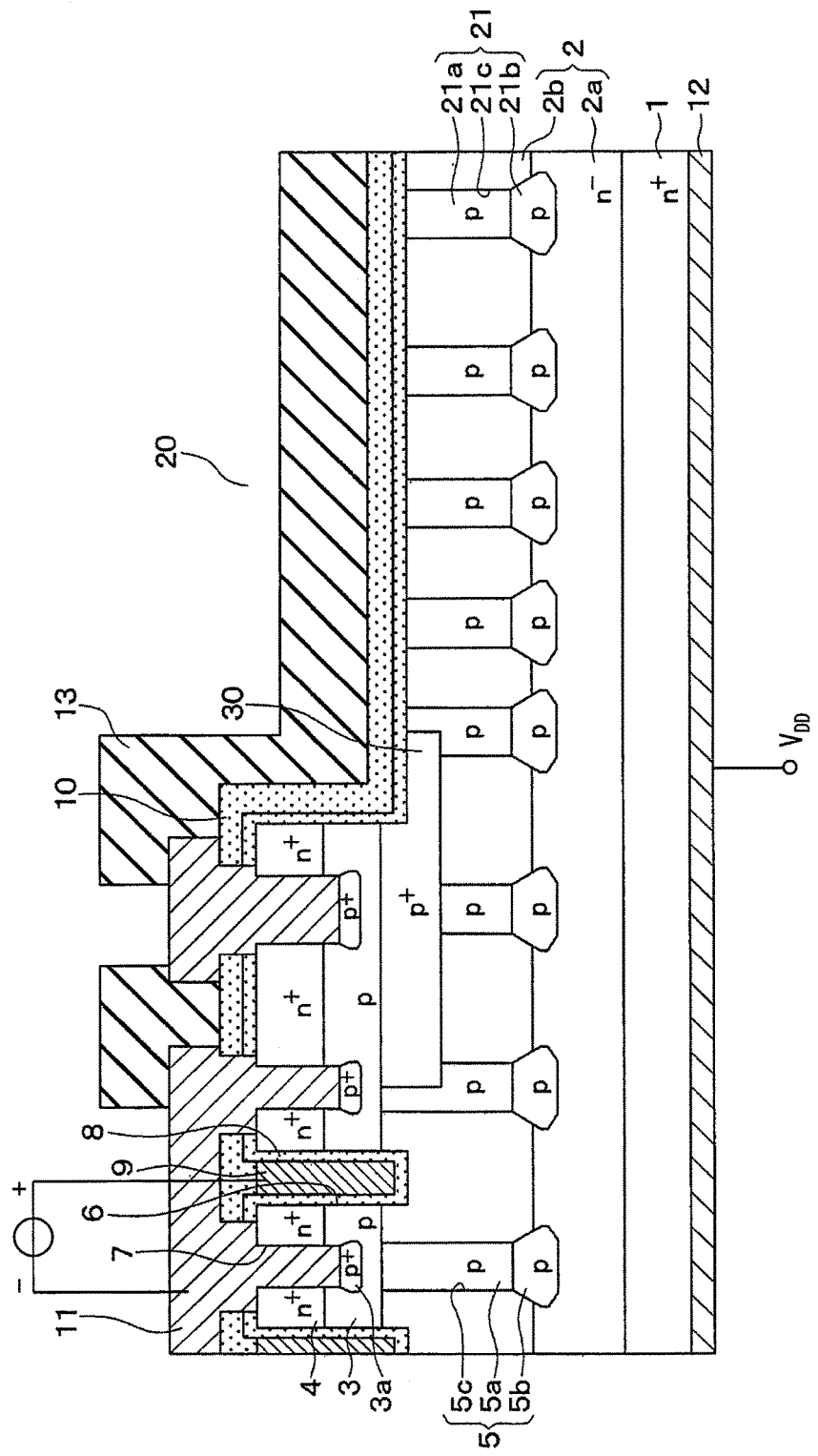
FIG. 2 is a cross section taken along the line II-II of FIG. 1.

As is shown in FIG. 2, the SiC semiconductor device is formed by using an $n^+$-type substrate 1 made of SiC. An n-type drift layer 2, a p-type base region 3, and an $n^+$-type source region 4 all made of SiC are epitaxially grown in sequence on a main surface of the $n^+$-type substrate 1.

The $n^+$-type substrate 1 has an n-type impurity concentration of, for example, $6.0 \times 10^{18}$ ions/cm$^3$ and a thickness of about 300 µm. In the n-type drift layer 2, an n-type impurity concentration is changed between a lower layer portion 2a and an upper layer portion 2b. The lower layer portion 2a has an impurity concentration of, for example, $1.0 \times 10^{16}$ ions/cm$^3$ and a thickness of 9 µm. The upper layer portion 2b is more heavily doped than the lower layer portion to function as a dispersion layer which disperses a current in a wide range, and has an impurity concentration of, for example, 2.0 to $3.0 \times 10^{16}$ ions/cm$^3$ and a thickness of 1.9 µm.

The p-type base region 3 forms a channel epitaxial layer in which a channel region is induced, and has a p-type impurity concentration of, for example, $2.0 \times 10^{17}$ ions/cm$^3$ and a thickness of about 0.5 µm. The $n^+$-type source region 4 is more heavily doped than the n-type drift layer 2, and has an n-type impurity concentration in a top-layer portion of, for example, $8.0 \times 10^{18}$ ions/cm$^3$ and a thickness of about 0.4 µm.

In the cell region, the p-type base region 3 and the $n^+$-type source region 4 are left on a surface side of a semiconductor substrate. In the outer peripheral region, a recess portion 20 is provided to reach the n-type drift layer 2 by penetrating through the $n^+$-type source region 4 and the p-type base region 3 and therefore a mesa structure is formed.

In the cell region, a p-type deep layer 5 extending from a bottom surface of the p-type base region 3 is provided to reach the lower layer portion 2a of the n-type drift layer 2 by penetrating through the upper layer portion 2b. The p-type deep layer 5 is more heavily doped with a p-type impurity than the p-type base region 3. More specifically, the p-type deep layer 5 has an upper deep layer (first layer) 5a embedded in a linear trench (deep trench) 5c provided to the n-type drift layer 2, and a lower deep layer (second layer) 5b provided by implanting ions of a p-type impurity into a bottom surface of the trench 5c. An extending direction of the p-type deep layer 5 may be determined arbitrarily. However, by extending the p-type deep layer 5 in a <11-20> direction and setting both two opposing wall surfaces forming long sides of the trench 5c in a same (1-100) plane, layers grow equally on both the two wall surfaces by embedded epitaxy. Hence, not only can a homogenous film quality be obtained, but also a poor embedding restricting effect can be obtained.

As is shown in FIG. 1, multiple p-type deep layers 5 are disposed in stripes at regular intervals. The upper deep layer 5a of each p-type deep layer 5 has a constant width W1. As is shown in FIG. 1, a top surface shape of the p-type deep layer 5 is rounded at both ends in a longitudinal direction of the deep layer 5.

The upper deep layer 5a has a p-type impurity concentration of, for example, $6.0 \times 10^{17}$ ions/cm$^3$, a width of 0.7 µm, and a thickness (width) of about 1.6 µm. The lower deep layer 5b is more lightly doped with a p-type impurity than the upper deep layer 5a, and has a p-type impurity concentration of, for example, 1.0 to $3.0 \times 10^{17}$ ions/cm$^3$ and a thickness (depth) of about 0.9 µm. The lower deep p layer 5b having a lower impurity concentration than the upper deep p layer is capable of relaxing field concentration at corners of the deep p layer 5 and therefore has a higher breakdown voltage. As is shown in FIG. 1, the p-type deep layer 5 including the upper deep layer 5a and the lower deep layer 5b is provided across the cell region from one end to the other. The p-type deep layer 5 extends in the longitudinal direction which is a same direction as a trench gate structure described below, and extends beyond both ends of the trench gate structure to an outside of the cell region.

In FIG. 2, the lower deep layer 5b is shown slightly wider than the upper deep layer 5a, because the p-type impurity slightly spreads due to ion implantation and thermal diffusion. However, such spreading is small in comparison with spreading in Si or the like and widths of the lower deep layer 5b and the upper deep layer 5a have little difference.

A gate trench 6 having, for example, a width of 0.8 µm and a depth of 1.0 µm is provided to reach the n-type drift layer 2 by penetrating through the p-type base region 3 and the n$^+$-type source region 4. The p-type base region 3 and the n$^+$-type source region 4 are disposed to be in contact with a side surface of the gate trench 6. The gate trench 6 is formed in a linear shape having a width direction, a longitudinal direction, and a depth direction which coincide, respectively, with a right-left direction of a sheet surface of FIG. 2, a direction perpendicular to the sheet surface, and a top-bottom direction of the sheet surface. As is shown in FIG. 1, multiple gate trenches 6 are arranged in stripes aligned parallel to one another at regular intervals.

One trench 7 extending in a same direction as the gate trench 6 is provided between every two adjacent gate trenches 6 and on either side having all the gate trenches 6 in between, that is, at a position corresponding to where each p-type deep layer 5 is provided in the cell region. Multiple trenches 7 disposed among and on both sides of the gate trenches 6 are arranged in stripes. The trench 7 is provided to reach the p-type base region 3 by penetrating through the n$^+$-type source region 4. A p$^+$-type contact region 3a is provided at a bottom of the trench 7 by implanting a p-type impurity into the p-type base region 3.

An inner wall surface of the gate trench 6 is covered with a gate insulating film 8. The gate insulating film 8 is formed of a thermally oxidized film formed by, for example, thermally oxidizing the inner wall surface of the gate trench 6. A thickness of the gate insulating film 8 is, for example, about 75 nm on both a side surface side and a bottom side of the gate trench 6. In FIG. 1 and FIG. 2, the gate insulating film 8 has angular corners at the bottom of the gate trench 6 and at both ends in the longitudinal direction. However, the corners can be round by applying a rounding treatment to the gate trench 6 in advance.

A gate electrode 9 is provided to fill the gate trench 6 on a surface of the gate insulating film 8. The gate electrode 9 is made of, for example, Poly-Si doped with an impurity.

A source electrode 11 and a gate wiring (not shown) are provided to surfaces of the n$^+$-type source region 4 and the p$^+$-contact region 3a and a surface of the gate electrode 9 via an interlayer insulating film 10. The source electrode 11 and the gate wiring are made of more than one type of metal (for example, Ni and Al), and at least a portion coming into contact with n-type SiC (to be more specific, the n$^+$-type source region 4) is made of metal capable of making ohmic contact with n-type SiC, and at least a portion coming into contact with p-type SiC (to be more specific, the p$^+$-type contact region 3a) is made of metal capable of making ohmic contact with p-type SiC. The source electrode 11 and the gate wiring are provided on the interlayer insulating film 10 and are therefore electrically isolated. Through a contact hole provided to the interlayer insulating film 10, the source electrode 11 is brought into electrical contact with the p-type base region 3 via the n$^+$-type source region 4 and the p$^+$-type contact region 3a, while the gate wiring is brought into electrical contact with the gate electrode 9.

A drain electrode 12 is provided to a back surface side of the n$^+$-type substrate 1 and electrically connected to the n$^+$-type substrate 1. A passivation film 13 is provided to a substrate front surface side. The source electrode 11 and the gate wiring are exposed in part from an opening provided to the passivation film 13. The exposed portion is used as a pad to establish external electrical connection. Owing to the structure as above, an n-channel, inverting, trench gate MOSFET is formed. The cell region is formed by disposing such MOSFETs in multiple cells.

Meanwhile, as has been described, the outer peripheral region has a mesa structure by providing the recess portion 20 to reach the n-type drift layer 2 by penetrating through the n$^+$-type source region 4 and the p-type base region 3. Hence, the p-type base region 3 is removed and the n-type drift layer 2 is exposed at a location remote from the cell region.

Multiple (four in FIG. 1) p-type guard ring layers 21 are provided to the top-layer portion of the n-type drift layer 2 located below the recess portion 20 and nested while enclosing the cell region. The p-type guard ring layer 21 includes an upper guard ring 21a embedded in a trench (guard ring trench) 21c, and a lower guard ring 21b provided at a bottom of the upper guard ring 21a. Respective parts forming the p-type guard ring layer 21 are formed in a same manner as the p-type deep layer 5 described above except for one point. That is, in contrast to the trench 5c formed in a linear shape, a top surface of the trench 21c is of a linear frame shape enclosing the cell region. In other words, the upper guard ring 21a is same as the upper deep layer 5a in width and thickness (depth) and the lower guard ring 21b is same as the lower deep layer 5b in width and thickness (depth). Intervals among the p-type guard ring layers 21 may be equal. However, intervals among the p-type guard ring layers 21 are made narrower on the cell region side and wider on the outer peripheral side for an equipotential line to head toward the outer periphery by relaxing field concentration more on an inner peripheral side, that is, on the cell region side.

A p$^+$-type coupling layer 30 having an impurity concentration of, for example, $1.0 \times 10^{18}$ ions/cm$^3$ and a thickness (depth) of about 0.9 µm is provided to the top-layer portion of the n-type drift layer 2 from the cell region at a vicinity of the outer peripheral region to the outer peripheral region. The p$^+$-type coupling layer 30 couples the p-type deep layer 5 located in the cell region on the outer peripheral region side, to be more specific, the p-type deep layer 5 located more on the outer peripheral region side than all the gate trenches 6, to one p-type guard ring layer 21 located nearest to the cell region side. Accordingly, a boundary position of the recess portion 20 (a boundary position of the mesa structure) overlaps the p$^+$-type coupling layer 30, and a bottom surface of the recess portion 20 at the boundary position is not formed of a surface of the n-type drift layer 2 but formed of the p$^+$-type coupling layer 30 while a portion of the p-type guard ring layer 21 on the cell region side is fixed at source potential.

Although it is not shown in the drawings, by providing an EQR structure on a more outer peripheral side than the p-type guard ring layers 21 when necessary, an outer peripheral region provided with an outer peripheral breakdown voltage structure enclosing the cell region is formed.

Owing to the structure as above, the SiC semiconductor device of the present embodiment is formed. The SiC semiconductor device formed as above induces a channel region in a surface portion of the p-type base region 3 located on the side surface of the gate trench 6 by controlling an applied voltage to the gate electrode 9 to switch ON the MOSFET. A current thus flows between the source electrode 11 and the drain electrode 12 via the n$^+$-type source region 4 and the n-type drift layer 2.

While the MOSFET is OFF, even when a high voltage is applied, an electric field is restricted from entering the bottom of the gate trench by the p-type deep layer 5 provided deeper than the trench gate structure. Hence, field concentration at the bottom of the gate trench is relaxed, which can in turn prevent breaking of the gate insulating film 8. In the outer peripheral region, equipotential lines terminate while intervals are widened toward the outer periphery by the p-type guard ring layers 21. Hence, a desired breakdown voltage can be obtained in the outer peripheral region, too. The SiC semiconductor device is thus capable of obtaining a desired breakdown voltage.

A method for manufacturing the SiC semiconductor device of the present embodiment will now be described with reference to FIG. 3A through FIG. 6D.

Figure 3A:
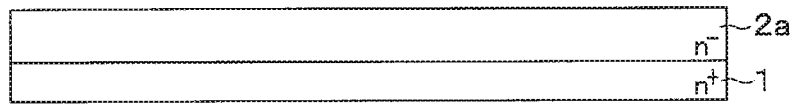
FIG. 3A through FIG. 3E are cross sections showing a manufacturing operation of the SiC semiconductor device shown in FIG. 1 and FIG. 2.

Process Shown in FIG. 3A

Firstly, the n$^+$-type substrate 1 made of SiC and having an n-type impurity concentration of, for example, $6.0 \times 10^{18}$ ions/cm$^3$ and a thickness of 300 µm is prepared as a semiconductor substrate. The lower layer portion 2a made of SiC and having, for example, an n-type impurity concentration of $1.0 \times 10^{16}$ ions/cm$^3$ and a thickness of 9 µm is epitaxially grown on a main surface of the n$^+$-type substrate 1.

Figure 3B:
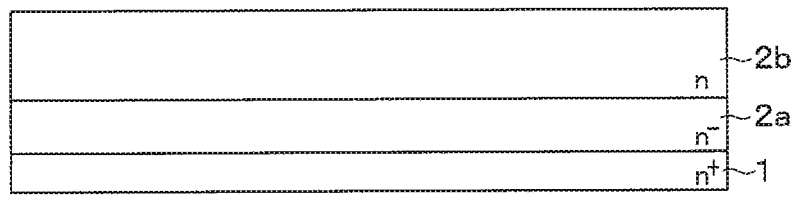

Process Shown in FIG. 3B

Subsequently, the upper layer portion 2b made of SiC, and having an n-type impurity concentration higher than the lower layer portion 2a of, for example, 2.0 to $3.0 \times 10^{16}$ ions/cm$^3$ and a thickness of 2.4 µm is epitaxially grown on a surface of the lower layer portion 2a.

Figure 3C:
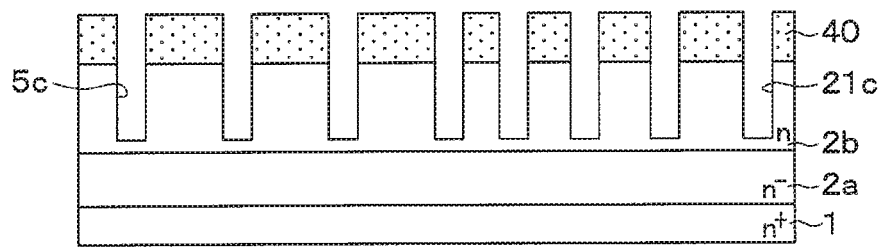

Process Shown in FIG. 3C

An oxide film 40 having, for example, a film thickness of about 2 µm is deposited on the upper layer portion 2b. Subsequently, the oxide film 40 is patterned by a photo-etching process using an unillustrated mask to provide openings in the oxide film 40 in regions where the trenches 5c for the p-type deep layers 5 and the trenches 21c for the p-type guard ring layers 21 are to be provided. The upper layer portion 2a is anisotropically etched away by RIE (Reactive Ion Etching) or the like by using the patterned oxide film 40 as a mask. The trenches 5c and 21c having, for example, a width of 0.7 µm and a depth of 2.1 µm are thus provided.

Figure 3D:
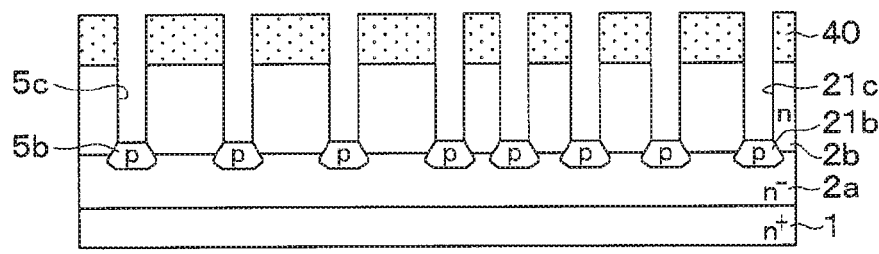

Process Shown in FIG. 3D

Ions of a p-type impurity, such as Al, are implanted in multiple steps in a depth direction by continuously using the oxide film 40 as the mask, and subjected to heating. The lower deep layers 5b and the lower guard rings 21b having a p-type impurity concentration of, for example, 1.5 to $2.0 \times 10^{17}$ ions/cm$^3$ and a thickness (depth) of 0.9 µm are thus provided.

Figure 3E:
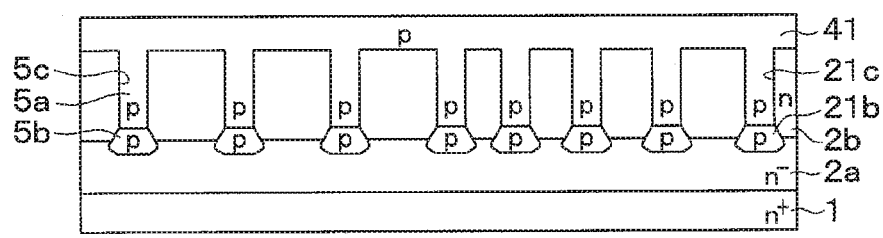

Process Shown in FIG. 3E

After the oxide film 40 is removed, a p-type layer 41 having a p-type impurity concentration of, for example, $6.0 \times 10^{17}$ ions/cm$^3$ is deposited. Herein, the p-type layer 41 is embedded also in the trenches 5c and 21c by embedded epitaxy. However, because the trenches 5c and 21c are formed in a same width, occurrences of a shape abnormality and irregularities on a surface of the p-type layer 41 can be restricted. Hence, the surface of the p-type layer 41 is of a planar shape without irregularities.

Figure 4A:
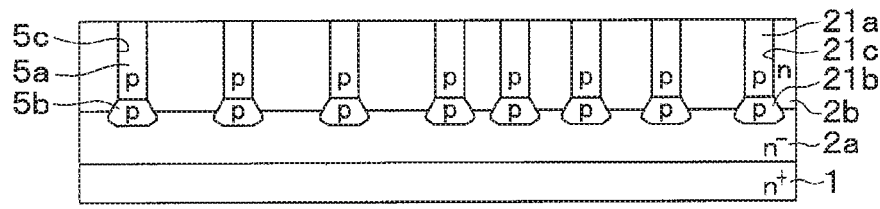
FIG. 4A through FIG. 4D are cross sections showing the manufacturing operation of the SiC semiconductor device continuing from FIG. 3E.

Process Shown in FIG. 4A

The p-type layer 41 is etched back by drying etching to remove a portion provided upper than the surface of the upper layer portion 2b. More specifically, the p-type layer 41 is over-etched to leave the upper layer portion 2b about 1.9 µm thick. The upper deep layers 5a and the upper guard rings 21a are thus provided. Because the surface of the p-type layer 41 is of a planar shape without irregularities as described above, surfaces of the upper deep layers 5a, the upper guard rings 21a, and the n-type drift layer 2 are planar, too. Accordingly, a desired gate shape can be obtained by various processes performed later to form the trench gate structure.

Figure 4B:
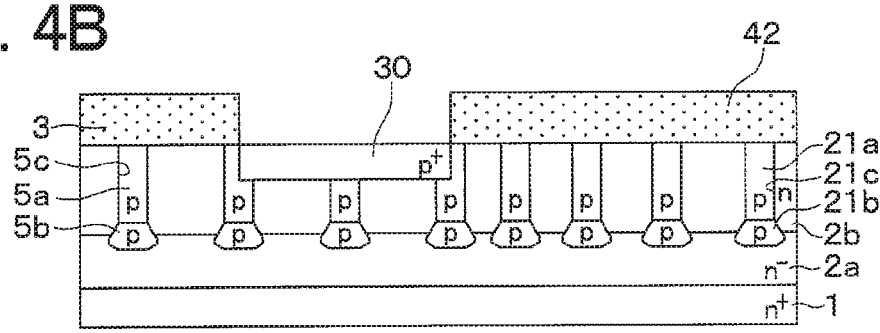

Process Shown in FIG. 4B

For example, an oxide film 42 is deposited as a mask on the upper deep layers 5a, the upper guard rings 21a, and the upper layer portion 2b. Subsequently, the oxide film 42 is patterned by a photo-etching process to provide an opening in a region where the p$^+$-type coupling layer 30 is to be provided. Ions of a p-type impurity, such as Al, are implanted by using the oxide film 42 as a mask. The p$^+$-type coupling layer 30 having a p-type impurity concentration of, for example, $1.0 \times 10^{18}$ ions/cm$^3$ and a thickness (depth) of about 0.9 µm is thus provided.

Figure 4C:
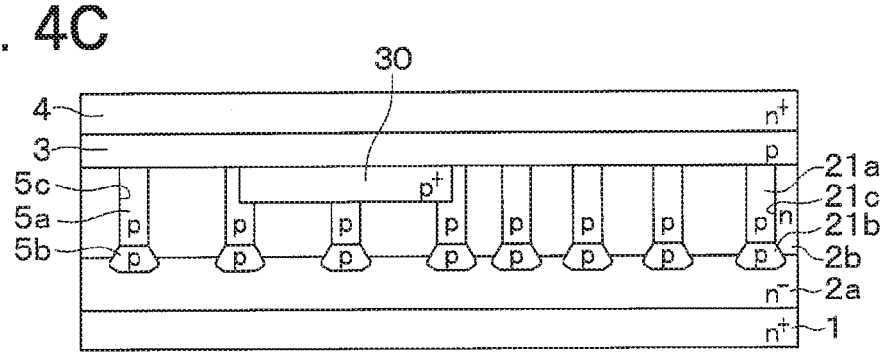

Process Shown in FIG. 4C

After the oxide film 42 is removed, the p-type base region 3 having a p-type impurity concentration of, for example, $2.0 \times 10^{17}$ ions/cm$^3$ and a thickness of about 0.5 µm, and the n$^+$-type source region 4 having an n-type impurity concentration in a top-layer portion of, for example, $8.0 \times 10^{18}$ ions/cm$^3$ and a thickness of about 0.4 µm are epitaxially grown in succession.

Figure 4D:
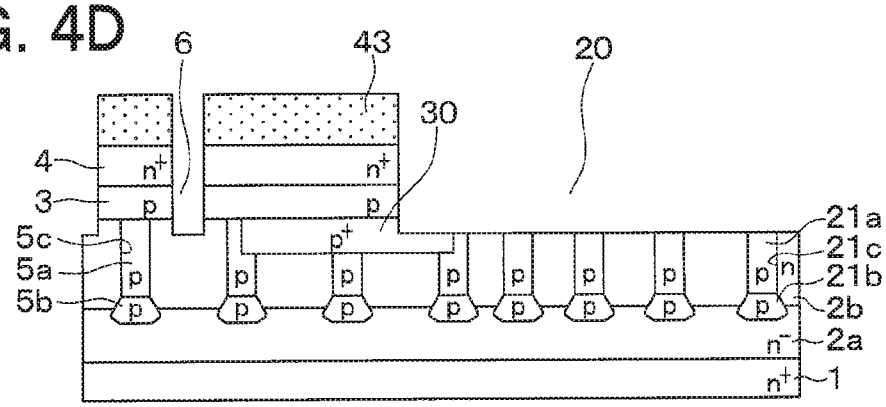

Process Shown in FIG. 4D

For example, an oxide film 43 is deposited as a mask on the n⁺-type source region 4. Subsequently, the oxide film 43 is patterned by a photo-etching process using an unillustrated mask to provide openings in the oxide film 43 in regions where the gate trench 6 and the recess potion 20 are to be provided. The n⁺-type source region 4, the p-type base region 3, and the n-type drift layer 2 are anisotropically etched away in part by RIE or the like by using the patterned oxide film 43 as a mask. The gate trench 6 and the recess portion 20 are thus provided at a same time.

Figure 5A:
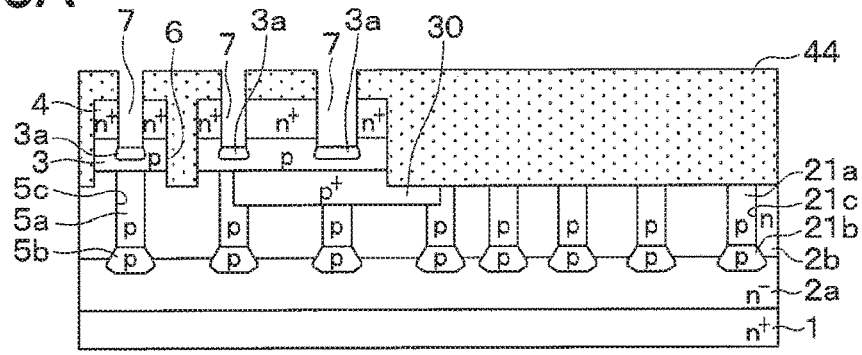
FIG. 5A through FIG. 5D are cross sections showing the manufacturing operation of the SiC semiconductor device continuing from FIG. 4D.

Process Shown in FIG. 5A

After the oxide film 43 is removed, for example, an oxide film 44 as a mask is deposited again on the n⁺-type source region 4 and inside the gate trench 6 and the recess portion 20 as well. Subsequently, the oxide film 44 is patterned by a photo-etching process using an unillustrated mask to provide openings in the oxide film 44 in regions where the trenches 7 are to be provided. The n⁺-type source region 4 and the p-type base region 3 are anisotropically etched away in part by RIE or the like by using the patterned oxide film 44 as a mask. The trenches 7 are thus provided.

Ions of a p-type impurity, such as Al, are implanted in multiple steps in the depth direction by continuously using the oxide film 44 as the mask, and subjected to heating. The p⁺-type contact regions 3a are thus provided.

Figure 5B:
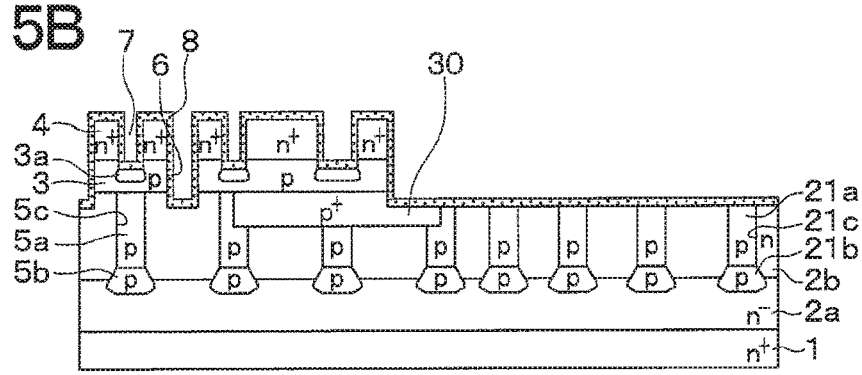

Process Shown in FIG. 5B

The inner wall surface of the gate trench 6 and the surface of the n⁺-type source region 4 are covered with the gate insulating film 8 formed of a thermally oxidized film by performing, for example, a thermal oxidization process.

Figure 5C:
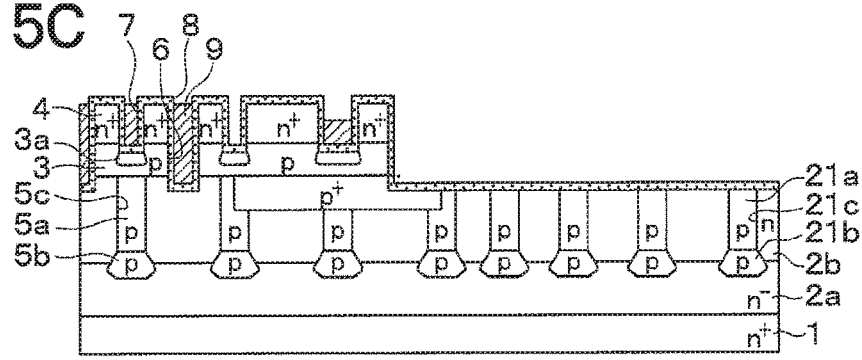

Process Shown in FIG. 5C

Poly-Si doped with an p-type impurity or an n-type impurity is deposited. The gate electrode 9 is provided by leaving Poly-Si at least in the gate trench 6 by etching back deposited Poly-Si.

Figure 5D:
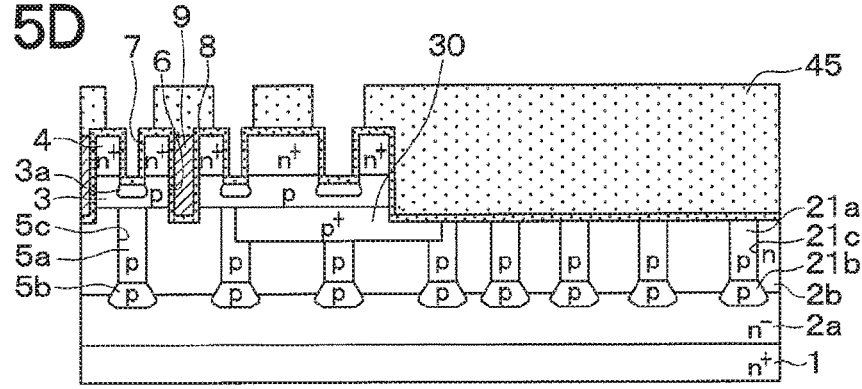

Process Shown in FIG. 5D

For example, an oxide film 45 is deposited as a mask on surfaces of the gate electrode 9 and the gate insulating film 8. Subsequently, the oxide film 45 is patterned by a photo-etching process using an illustrated mask to provide openings in the oxide film 45 in regions corresponding to the trenches 7. Poly-Si left in the trenches 7 is removed by using the patterned oxide film 45 as a mask.

Figure 6A:
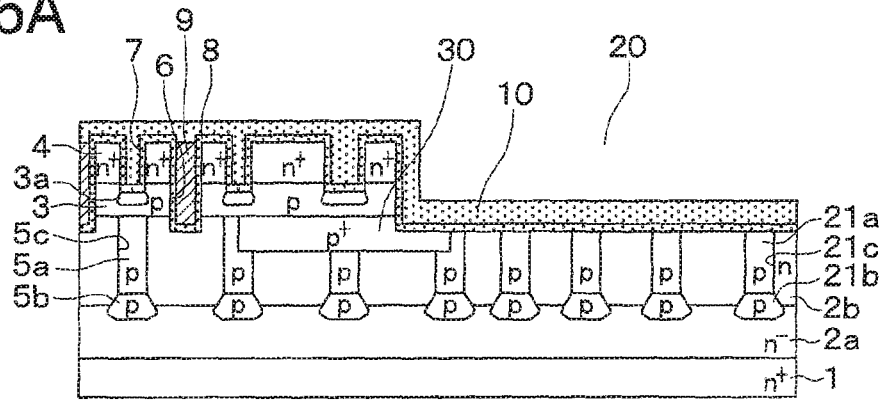
FIG. 6A through FIG. 6D are cross sections showing the manufacturing operation of the SiC semiconductor device continuing from FIG. 5D.

Process Shown in FIG. 6A

The interlayer insulating film 10 formed of, for example, an oxide film is provided to cover surfaces of the gate electrode 9 and the gate insulating film 8.

Figure 6B:
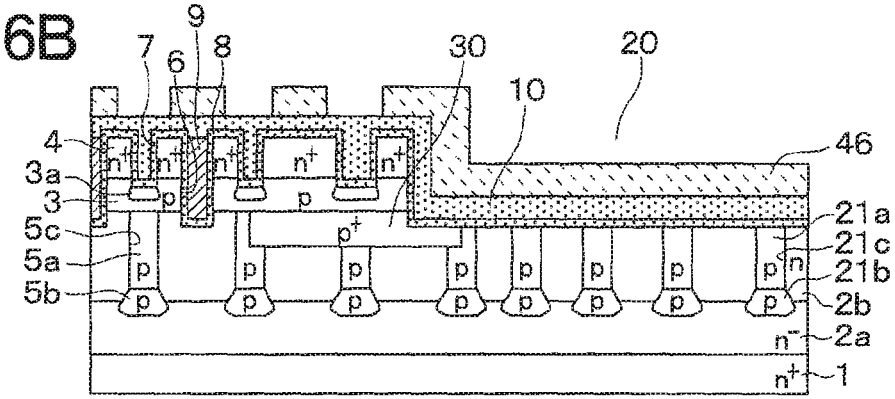

Process Shown in FIG. 6B

For example, a resist 46 is deposited as a mask on a surface of the interlayer insulating film 10. Subsequently, the resist 46 is exposed to light by a photo process using an unillustrated mask to provide openings in the resist 46 in regions corresponding to the trenches 7. The interlayer insulating film 10 and the gate insulating film 8 left in the trenches 7 are removed by using the patterned resist 46 as a mask.

Figure 6C:
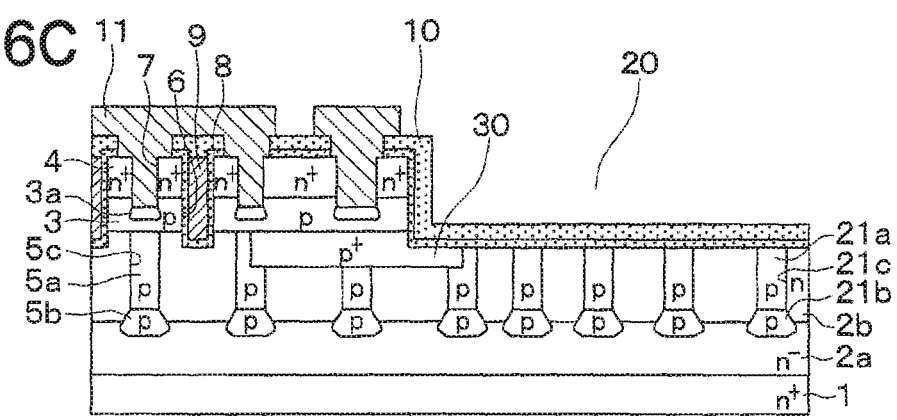

Process Shown in FIG. 6C

An electrode material, which is, for example, a laminated structure of more than one type of metal, is provided on the surface of the interlayer insulating film 10 and inside the trenches 7 as well. The source electrode 11 and the gate wiring are provided by patterning the electrode material. In a cross section different from FIG. 6C, a gate extraction portion connected to the gate electrode 9 in each cell is provided. By providing a contact hole in the interlayer insulating film 10 at the extraction portion, the gate wiring and the gate electrode 9 are electrically connected.

Figure 6D:
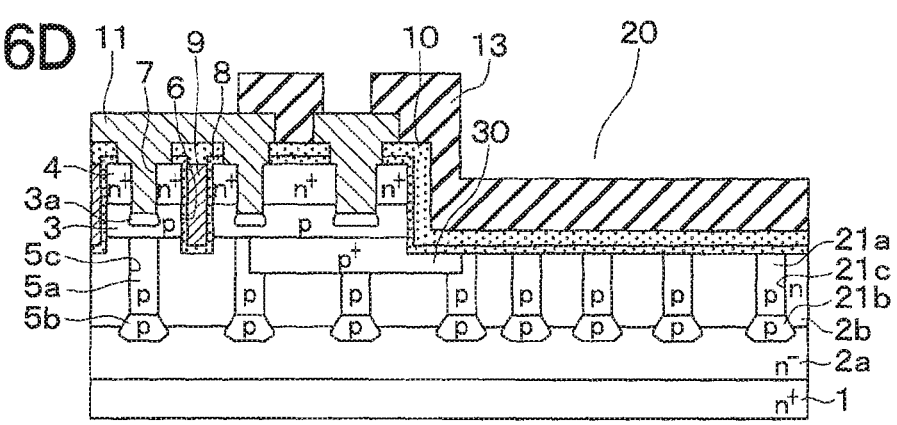

Process Shown in FIG. 6D

After the passivation film 13 is deposited entirely on the substrate surface side, openings are provided by patterning for the source electrode 11 and the gate wiring to be exposed in part.

Subsequent processes are not shown in the drawings. However, the SiC semiconductor device of the present embodiment is completed by providing the drain electrode 12 on the back surface side of the n⁺-type substrate 1.

As has been described, the trenches 5c and 21c in which to provide the p-type deep layers 5 and the p-type guard ring layers 21, respectively, are formed in a same width in the present embodiment. Hence, a shape abnormality and irregularities on the surface of the p-type layer 41 occurring when embedded into the trenches 5c and 21c by embedded epitaxy can be restricted. Because the surface of the p-type layer 41 can be of a planar shape without irregularities, processing is applied to the planar surface in subsequent processes. Hence, a described gate shape can be obtained by various processes performed to form the trench gate structure.

Consequently, not only can leakage through the gate insulating film 8 be reduced, but also a required life can be realized owing to a capability of relaxing an electric field at the bottom of the trench.

Second Embodiment

A second embodiment of the present disclosure will be described. The present embodiment is same as the first embodiment above except that a configuration of a p-type guard ring layer 21 is changed from the configuration of the first embodiment above, and only a difference from the first embodiment above will be described in the following.

Figure 7:
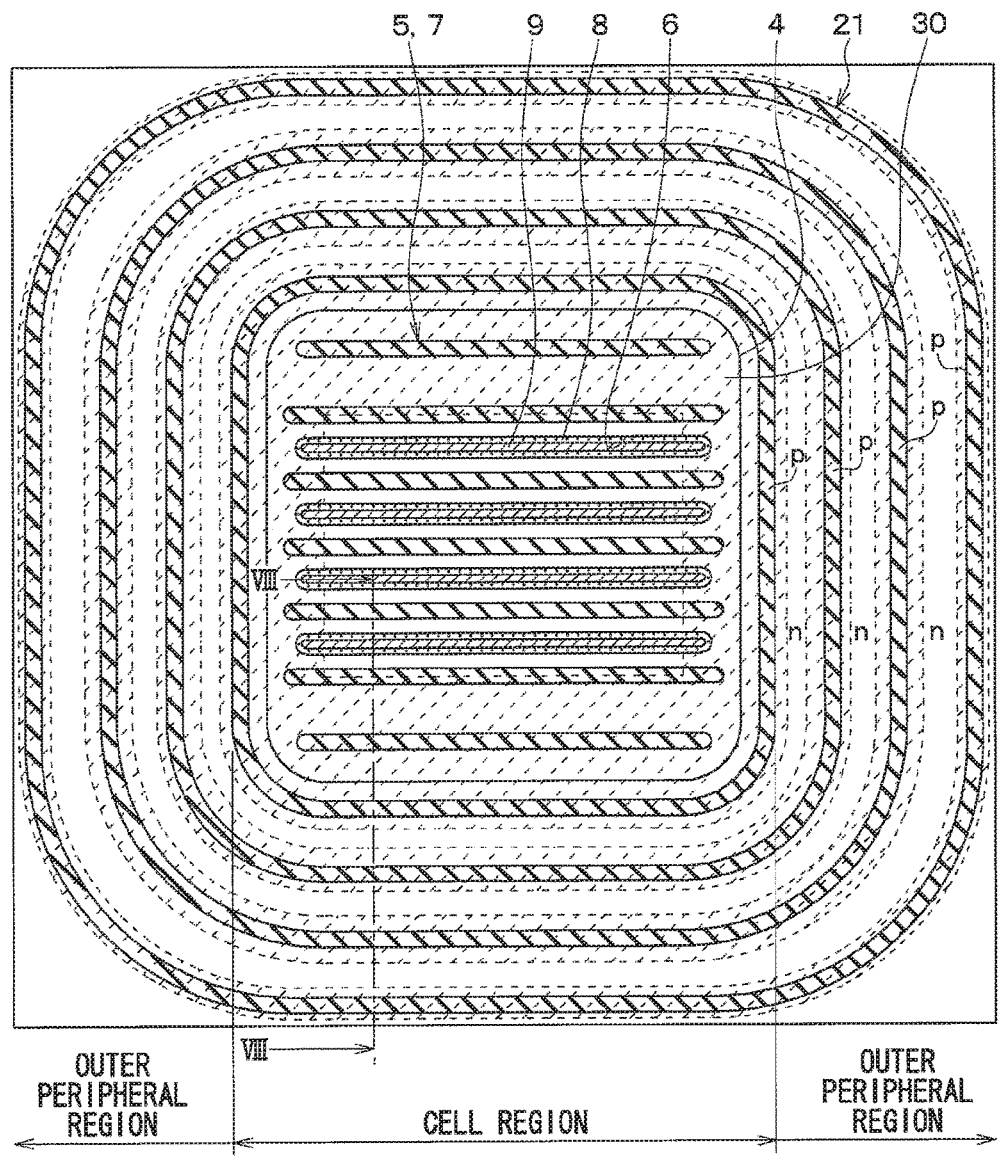
FIG. 7 is a view showing a layout on a top surface of a SiC semiconductor device according to a second embodiment of the present disclosure.
Figure 8:
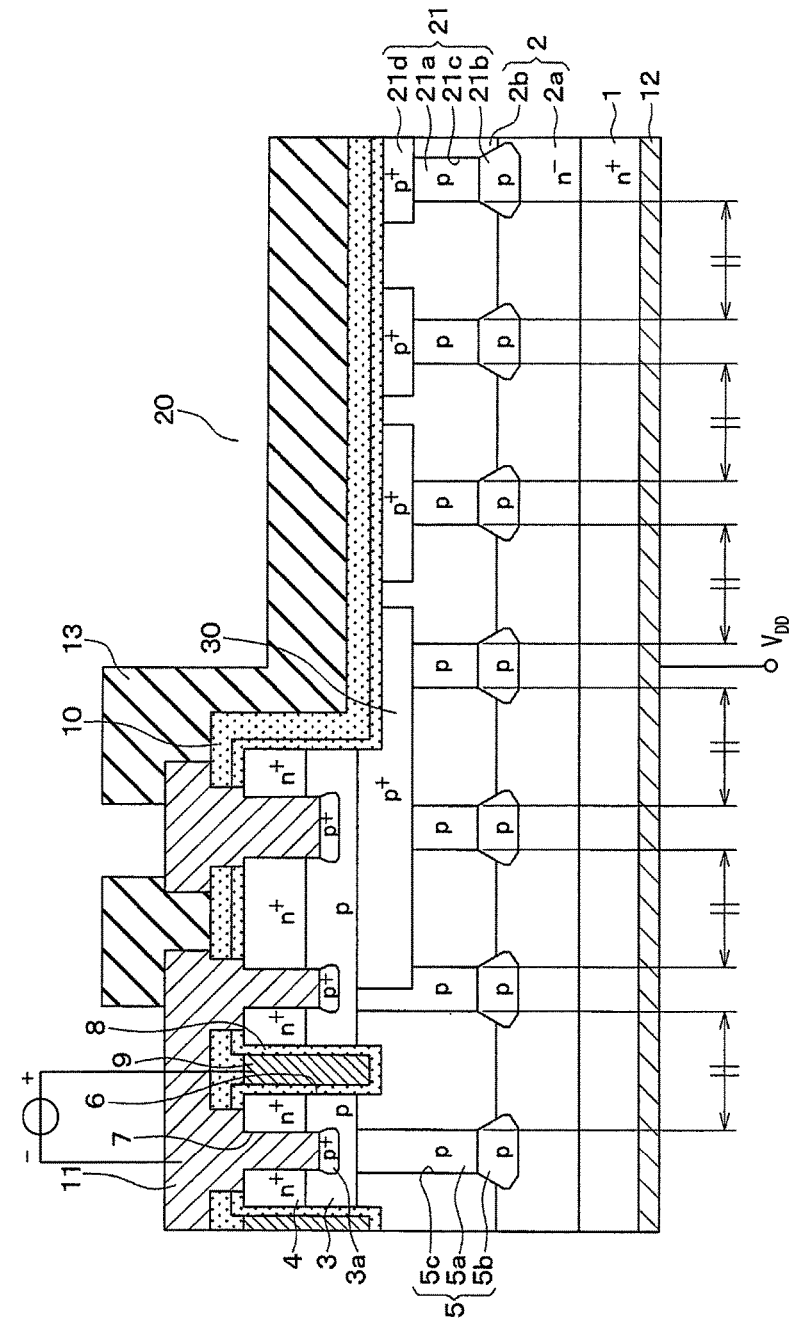
FIG. 8 is a cross section taken along the line VIII-VIII of FIG. 7.

In the first embodiment above, intervals among the p-type guard ring layers 21 are narrower on the cell region side and wider on the outer peripheral side and intervals among the upper deep layer 5a and the lower deep layers 5b are set in the same manner. By contrast, a same structure is formed in the present embodiment by setting intervals among upper deep layers 5a and lower deep layers 5b constant and providing a p⁺-type impurity layer 21d as a part of a p-type guard ring layer 21 as are shown in FIG. 7 and FIG. 8. That is, p⁺-type impurity layers 21d are provided to a top-layer portion of an n-type drift layer 2 to overlap the respective upper deep layers 5a and intervals among the p⁺-type impurity layers 21d are made narrower on a cell region side and wider on an outer peripheral side. The p⁺-type impurity layers 21d are provided by implanting ions of a p-type impurity and all are same in depth and impurity concentration. For example, the p⁺-type impurity layers 21d and a p⁺-type coupling layer 30 may be provided at a same time. By providing the p⁺-type impurity layers 21d and the p⁺-type coupling layer 30 at a same time, the p⁺-type impurity layers 21d can be provided without having to add a process required only to provide the p⁺-type impurity layers 21d.

In the manner as above, intervals among the p-type guard ring layers 21 can be adjusted by neither upper guard rings 21a provided in trenches 21c nor lower guard rings 21c provided at bottoms of the trenches 21c, but by the p⁺-type impurity layers 21d which can be provided individually by ion implantation. Owing to the configuration as above, intervals among the trenches 21c are made constant and equal to intervals among trenches 5.

For example, in a case where intervals among the trenches 21c are varied as in the first embodiment above, rough and dense trench forming areas are present between the cell region in which the trenches 5c are provided and the outer peripheral region in which the trenches 21c are provided. Hence, a recess may possibly occur in the p-type layer 41 when embedded. In the present embodiment, however, intervals among the trenches 21c can be constant and equal to intervals among the trenches 5c. Hence, generation of rough and dense trench forming areas between the cell region and the outer peripheral region can be restricted. Consequently, a recess in the p-type layer 41 occurring when embedded into the trenches 5c and 21c can be restricted further.

Third Embodiment

A third embodiment of the present disclosure will be described. The present embodiment is same as the first and second embodiments above except that the p-type deep layer 5 and the p-type guard ring layer 21 of the first and second embodiments above are connected, and only a difference from the first and second embodiments above will be described in the following. The following will describe a case where a configuration of the present embodiment is applied to the layout of the first embodiment above as an example. However, an outcome is same when the configuration of the present embodiment is applied to the layout of the second embodiment above.

Figure 9:
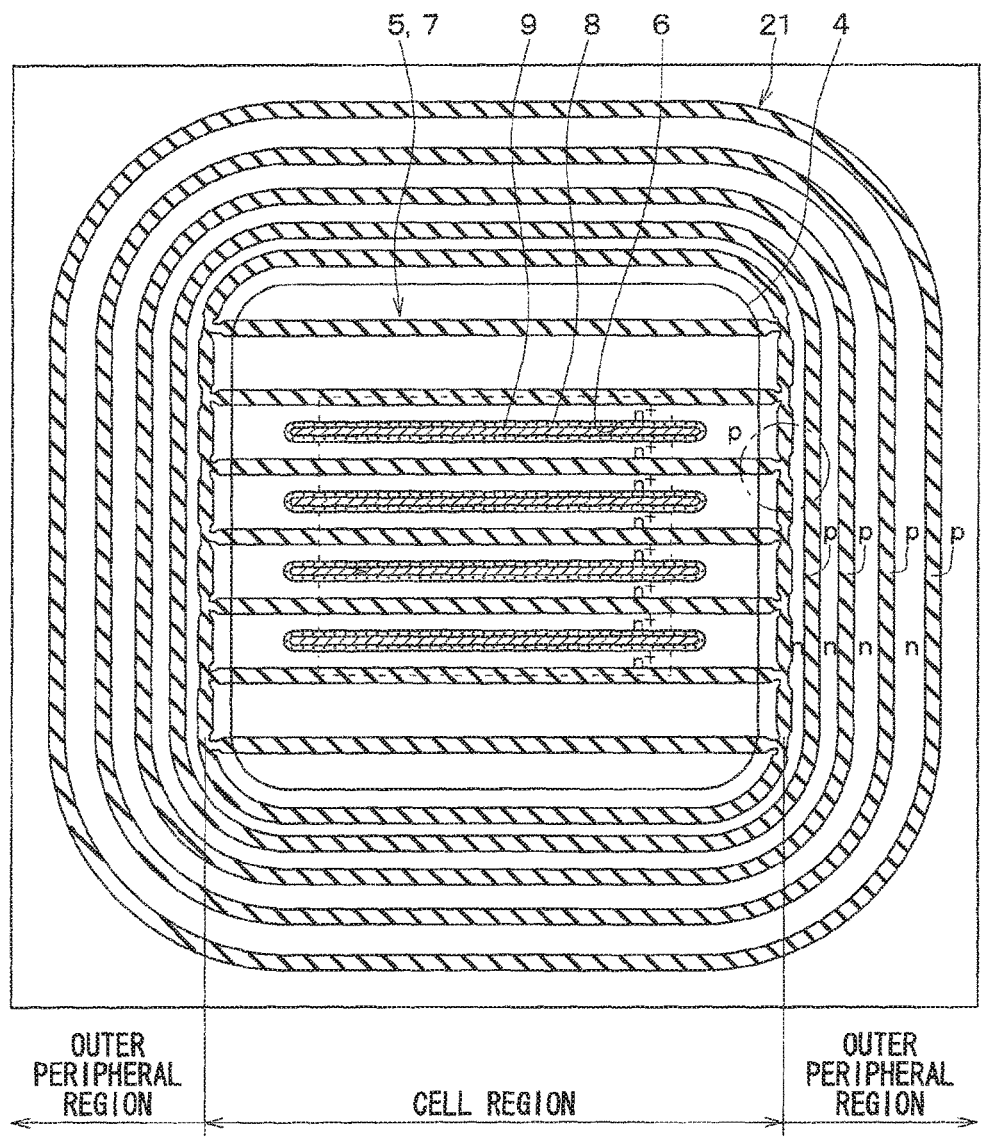
FIG. 9 is a view showing a layout on a top surface of a SiC semiconductor device according to a third embodiment of the present disclosure.
Figure 10:
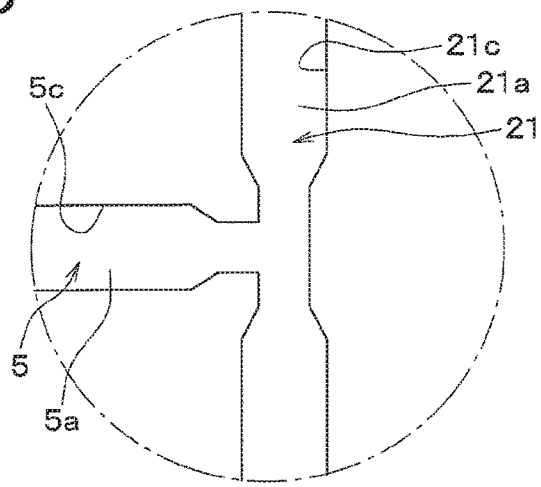
FIG. 10 is an enlarged view of a portion encircled by an alternate long and short dash line of FIG. 9.
Figure 11A:
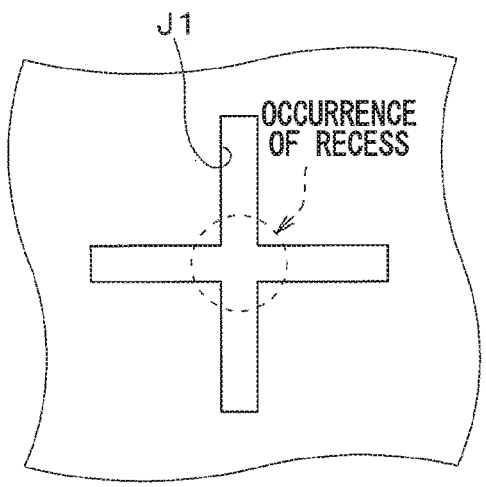
FIG. 11A and FIG. 11B are views showing examples of a layout of trenches J1 with a recess on a surface of layers occurring when embedded into the trenches J1 by an embedded epitaxial technique.
Figure 11B:
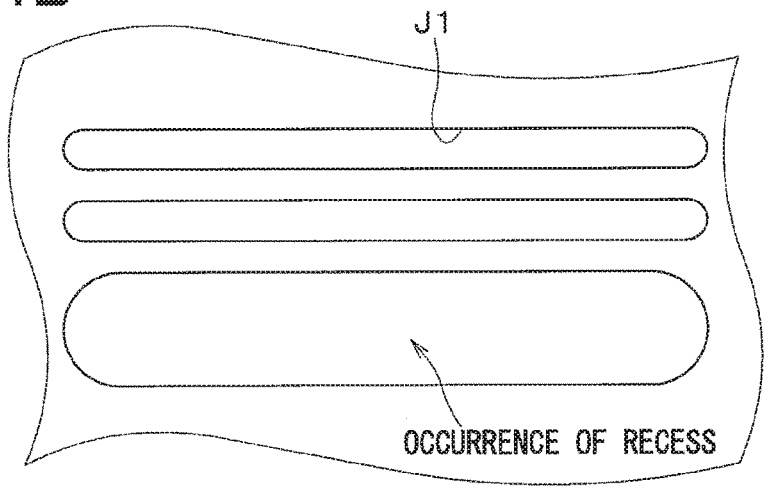

In the present embodiment, as is shown in FIG. 9, a p-type deep layer 5 is connected to a p-type guard ring layer 21 at both ends in a longitudinal direction. It is, however, necessary to prevent an embedded region from spreading at connection portions of the p-type deep layer 5 and the p-type guard ring layer 21. To satisfy such a need, as is shown in FIG. 10, the p-type deep layer 5 is made narrower at the both ends in the longitudinal direction than on a cell region side in the present embodiment. Likewise, the p-type guard ring layer 21 is made narrower in the connection portions to the p-type deep layer 5 than in a portion other than the connection portions.

Owing to the configuration as above, an effect same as the effect of the first embodiment above can be obtained by the structure in which the p-type deep layer 5 and the p-type guard ring layer 21 are connected.

Other Embodiments (1) The embodiments above have described a case where the p-type deep layer 5 includes the upper deep layer 5a and the lower deep layer 5b. However, a p-type deep layer 5 may include an upper deep layer 5a alone. In such a case, it is preferable to provide the p-type deep layer 5 deeper than an upper layer portion 2b more heavily doped than a lower layer potion 2a in restricting entrance of an electric field. Hence, a trench 5c may be provided preferably to penetrate through the upper layer portion 2b.

(2) In the embodiments above, the p-type base region 3 and the source electrode 11 are connected by a structure in which the source electrode 11 is brought into direct contact with the p-type base region 5 by providing the trench 7. However, the above configuration is a mere example, and a $p^+$-type contact region 3a may be provided by implanting ions of, for example, a p-type impurity, to reach a p-type base region 3 by penetrating through an $n^+$-type source region 4.

(3) In the embodiments above, the $n^+$-type source region 4 is epitaxially grown on the p-type base region 3 in succession. However, an $n^+$-type source region 4 may be provided by implanting ions of an n-type impurity into the p-type base region 3 at a desired location.

(4) The first and second embodiments above have described a case where the p-type deep layer 5 is of a round shape at the both ends in the longitudinal direction. However, the tip ends may be of a pointed triangular shape or a flat surfaced square shape. In a case where the tip ends are of a triangular shape, when the p-type deep layer 5 extends in a <11-20> direction, a plane orientation of a wall surface forming two sides of the triangular tip at either end tends to be an equivalent (1-100) plane in a hexagonal crystal like SiC. Hence, layers grow equally on the respective equivalent planes by embedded epitaxy. Consequently, not only can a homogenous film quality be obtained, but also a poor embedding restricting effect can be obtained.

(5) The embodiments above have described an n-channel MOSFET in which a first conductive type is an n-type and a second condition type is a p-type as an example. However, the present disclosure is also applicable to a p-channel MOSFET in which conductive types of all components are reversed. The above has described a MOSFET as an example of a trench gate semiconductor element. However, the present disclosure is also applicable to a similar trench gate IGBT. In an IGBT, only a conductive type of the substrate 1 of the embodiments above is changed from the n type to the p type, and a structure and a manufacturing method are same as the structures and the manufacturing methods of the embodiments above.

(6) The embodiments above have described a SiC semiconductor device as an example. However, the present disclosure is also applicable to a semiconductor device made of other semiconductor materials, for example, a Si or GaN semiconductor device.

(7) A crystal orientation is supposed to be indicated by placing a bar (–) above an appropriate numeric character. However, due to a denotative restriction in an electronic filing system, a bar is placed before an appropriate numeric character herein.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
   a substrate with a first conductive type or a second conductive type having a cell region and an outer peripheral region; and
   a drift layer with the first conductive type arranged on the substrate and having an impurity concentration lower than the substrate, wherein:
   the cell region has a semiconductor element;
   the semiconductor element includes
   a base region with the second condition type arranged on the drift layer,
   a source region with the first conductive type arranged on the base region and having an impurity concentration higher than the drift layer,
   a trench gate structure having a gate trench arranged from a surface of the source region to be deeper than the base region, a gate insulating film arranged on an inner wall of the gate trench, and a gate electrode arranged on the gate insulating film,
a deep layer having a first layer embedded in each of a plurality of deep trenches that are arranged from a surface of the drift layer to be deeper than the gate trench and have a line shape,
a source electrode electrically connected to the source region and the base region, and
a drain electrode arranged on a back side of the substrate;
the semiconductor element provides a channel region in a surface portion of the base region located on a side of the gate trench by controlling a voltage applied to the gate electrode, and flows a current between the source electrode and the drain electrode via the source region and the drift layer;
the outer peripheral region surrounding an outer periphery of the cell region has a recess portion in which the source region and the base region are removed and the drift layer are exposed, and a guard ring layer;
the guard ring layer includes
a plurality of guard ring trenches having a line frame shape, surrounding the cell region and arranged on a surface of the drift layer exposed in the recess portion, and
a first guard ring with the second conductive type disposed in the guard ring trenches and having an impurity concentration equal to the first layer;
each of the linear deep trenches has a width equal to a width of each of the linear guard ring trenches; and
the deep trenches have a longitudinal direction equal to a <11-20> direction.

2. The semiconductor device according to claim 1, wherein:
each end of the deep layer having the line shape in the longitudinal direction is connected to the guard ring layer; and
a width of the deep layer and a width of the guard ring layer at a connection portion of the deep layer and the guard ring layer are respectively smaller than those at a portion other than the connection portion.

3. The semiconductor device according to claim 1, wherein:
a part of the deep layer is provided by a second layer with the second conductive type which is an ion implantation region and is arranged on a bottom of each of the deep trenches; and
a part of the guard ring layer is provided by a second guard ring with the second conductive type which is an ion implantation portion and is arranged on a bottom of each of the guard ring trenches.

4. A method for manufacturing the semiconductor device according to claim 1, the method comprising:
forming the drift layer on a main surface of the substrate;
arranging a mask on the drift layer having an opening for a deep-trench-to-be-formed region and a guard-ring-trench-to-be-formed region, and forming the deep trenches and the guard ring trenches at a same time by etching the drift layer using the mask;
epitaxially growing an impurity layer with the second conductive type on the drift layer to fill the deep trenches and the guard ring trenches; and
forming the first layer in each of the deep trenches and the first guard ring in each of the guard ring trenches by removing the impurity layer with the second conductive type formed on the drift layer and planarizing a surface.

5. The semiconductor device according to claim 1, wherein:
each end of the deep layer having the line shape in a longitudinal direction is spaced apart from the guard ring layer.

6. The semiconductor device according to claim 5, further comprising:
a coupling layer disposed to a surface portion of the drift layer that is an ion implantation portion of an impurity with the second condition type, and coupling a portion of the deep layer, disposed on a side of the outer peripheral region from a region of the deep layer where the semiconductor element is arranged, and the guard ring layer disposed on a position of the outer peripheral region closest to the cell region.

7. The semiconductor device according to claim 6, wherein:
a boundary of the recess portion overlaps the coupling layer; and
the coupling layer provides a bottom of the recess portion at the boundary.

8. The semiconductor device according to claim 6, wherein:
a distance between the plurality of deep trenches is equal to a distance between the plurality of guard ring trenches.

9. The semiconductor device according to claim 8, wherein:
the guard ring layer has a plurality of first guard rings and a plurality of second conductive type layers;
the first guard rings are respectively disposed in the plurality of guard ring trenches aligned at regular intervals;
the second conductive type layers are ion implantation portions of an impurity with the second conductive type, and overlap the first guard rings respectively; and
a distance between the plurality of second conductive type layers increases with a distance from the cell region.

10. The semiconductor device according to claim 9, wherein:
each of the second conductive type layers has a width and an impurity concentration equal to the coupling layer.

11. A semiconductor device comprising:
a substrate with a first conductive type or a second conductive type having a cell region and an outer peripheral region; and
a drift layer with the first conductive type arranged on the substrate and having an impurity concentration lower than the substrate, wherein:
the cell region has a semiconductor element;
the semiconductor element includes
a base region with the second condition type arranged on the drift layer,
a source region with the first conductive type arranged on the base region and having an impurity concentration higher than the drift layer,
a trench gate structure having a gate trench arranged from a surface of the source region to be deeper than the base region, a gate insulating film arranged on an inner wall of the gate trench, and a gate electrode arranged on the gate insulating film,
a deep layer having a first layer embedded in each of a plurality of deep trenches that are arranged from a surface of the drift layer to be deeper than the gate trench and have a line shape,
a source electrode electrically connected to the source region and the base region, and a drain electrode arranged on a back side of the substrate;
the semiconductor element provides a channel region in a surface portion of the base region located on a side of the gate trench by controlling a voltage applied to the gate electrode, and flows a current between the source electrode and the drain electrode via the source region and the drift layer;
the outer peripheral region surrounding an outer periphery of the cell region has a recess portion in which the source region and the base region are removed and the drift layer are exposed, and a guard ring layer;
the guard ring layer includes
a plurality of guard ring trenches having a line frame shape, surrounding the cell region and arranged on a surface of the drift layer exposed in the recess portion, and
a first guard ring with the second conductive type disposed in the guard ring trenches and having an impurity concentration equal to the first layer;
each of the linear deep trenches has a width equal to a width of each of the linear guard ring trenches; and
each end of the deep layer having the line shape in a longitudinal direction is spaced apart from the guard ring layer,
a coupling layer disposed to a surface portion of the drift layer that is an ion implantation portion of an impurity with the second condition type, and coupling a portion of the deep layer, disposed on a side of the outer peripheral region from a region of the deep layer where the semiconductor element is arranged, and the guard ring layer disposed on a position of the outer peripheral region closest to the cell region,
a distance between the plurality of deep trenches is equal to a distance between the plurality of guard ring trenches,
the guard ring layer has a plurality of first guard rings and a plurality of second conductive type layers,
the first guard rings are respectively disposed in the plurality of guard ring trenches aligned at regular intervals,
the second conductive type layers are ion implantation portions of an impurity with the second conductive type, and overlap the first guard rings respectively, and
a distance between the plurality of second conductive type layers increases with a distance from the cell region.

12. A semiconductor device comprising:
a substrate with a first conductive type or a second conductive type having a cell region and an outer peripheral region; and
a drift layer with the first conductive type arranged on the substrate and having an impurity concentration lower than the substrate, wherein:
the cell region has a semiconductor element;
the semiconductor element includes
a base region with the second condition type arranged on the drift layer,
a source region with the first conductive type arranged on the base region and having an impurity concentration higher than the drift layer,
a trench gate structure having a gate trench arranged from a surface of the source region to be deeper than the base region, a gate insulating film arranged on an inner wall of the gate trench, and a gate electrode arranged on the gate insulating film,
a deep layer having a first layer embedded in each of a plurality of deep trenches that are arranged from a surface of the drift layer to be deeper than the gate trench and have a line shape,
a source electrode electrically connected to the source region and the base region, and
a drain electrode arranged on a back side of the substrate;
the semiconductor element provides a channel region in a surface portion of the base region located on a side of the gate trench by controlling a voltage applied to the gate electrode, and flows a current between the source electrode and the drain electrode via the source region and the drift layer;
the outer peripheral region surrounding an outer periphery of the cell region has a recess portion in which the source region and the base region are removed and the drift layer are exposed, and a guard ring layer;
the guard ring layer includes
a plurality of guard ring trenches having a line frame shape, surrounding the cell region and arranged on a surface of the drift layer exposed in the recess portion, and
a first guard ring with the second conductive type disposed in the guard ring trenches and having an impurity concentration equal to the first layer;
each of the linear deep trenches has a width equal to a width of each of the linear guard ring trenches; and
each end of the deep layer having the line shape in the longitudinal direction is connected to the guard ring layer, and
a width of the deep layer and a width of the guard ring layer at a connection portion of the deep layer and the guard ring layer are respectively smaller than those at a portion other than the connection portion.

* * * * *